United States Patent
Chvalevsky

(10) Patent No.: US 11,062,077 B1
(45) Date of Patent: Jul. 13, 2021

(54) BIT-REDUCED VERIFICATION FOR MEMORY ARRAYS

(71) Applicant: Amazon Technologies, Inc., Reno, NV (US)

(72) Inventor: Max Chvalevsky, Mevaseret Zion, IL (US)

(73) Assignee: Amazon Technologies, Inc., Seattle, WA (US)

( * ) Notice: Subject to any disclaimer, the term of this patent is extended or adjusted under 35 U.S.C. 154(b) by 21 days.

(21) Appl. No.: 16/450,326

(22) Filed: Jun. 24, 2019

(51) Int. Cl.
    *G06F 9/455*     (2018.01)
    *G06F 30/398*     (2020.01)
    *G06F 30/3323*     (2020.01)

(52) U.S. Cl.
    CPC ........ *G06F 30/398* (2020.01); *G06F 30/3323* (2020.01)

(58) Field of Classification Search
    USPC .................... 714/30, 718, 733; 716/106, 112
    See application file for complete search history.

(56) References Cited

U.S. PATENT DOCUMENTS

| | | | | |
|---|---|---|---|---|
| 6,374,370 B1 * | 4/2002 | Bockhaus | ........... | G06F 11/2236 714/30 |
| 6,462,998 B1 * | 10/2002 | Proebsting | ........... | G11C 7/04 257/E21.659 |
| 2004/0049724 A1 * | 3/2004 | Bill | ........... | G11C 29/44 714/733 |
| 2005/0010743 A1 * | 1/2005 | Tremblay | ........... | G06F 9/3012 712/10 |
| 2010/0332924 A1 * | 12/2010 | Ziaja | ........... | G11C 29/32 714/718 |
| 2014/0237176 A1 * | 8/2014 | Takefman | ........... | G06F 12/0607 711/105 |
| 2015/0325314 A1 * | 11/2015 | Ziaja | ........... | G11C 7/1078 365/189.02 |
| 2018/0129440 A1 * | 5/2018 | Bandic | ........... | G06F 3/0688 |
| 2018/0267893 A1 * | 9/2018 | Barzik | ........... | G06F 12/0246 |
| 2019/0050285 A1 * | 2/2019 | Lin | ........... | G06F 11/1044 |
| 2019/0121725 A1 * | 4/2019 | Sehgal | ........... | G06F 12/0246 |

* cited by examiner

*Primary Examiner* — Brian Ngo
(74) *Attorney, Agent, or Firm* — Hogan Lovells US LLP

(57) ABSTRACT

Bit-reduction in a verification processes for memory arrays is disclosed. Properties are determined for verification of a circuit that includes a memory array. Circuit data for the circuit is received in a verification environment. When it is determined that the circuit includes a memory array, an address for the memory array is sampled as part of a read operation during verification for the circuit. A determination may be made that the circuit is in compliance with a property of the properties based at least in part on compliance of the read operation with a predetermined model. The sampling of the address replicates a delay expected in physical read operation of the memory array, but with reduced bits communicated or generated per cycle in the verification process because output data is not sampled contrasting the physical read operation.

20 Claims, 7 Drawing Sheets

BIT-REDUCED VERIFICATION FOR MEMORY ARRAYS

BACKGROUND

Verification of functionality of the components in a semiconductor device may be performed intermediate to or before any of the steps leading to the manufacture of each of the components. The complexity of designs for the components and the components themselves, however, have made the verification process challenging. For example, current day processors and memories include complex arrangements of many billions of the smallest scale transistors packed into these components. The scale has been shrinking according to Moore's law with nearly a doubling of the transistor density in the components almost every two years. As a result, verification tools, methods, and algorithms have also changed to address this complexity trend, and many verification-specific designs or algorithms are employed in the design process. Along these lines, simulation-based validation is one verification process that tests simulated circuits, in a verification environment, using verification designs or algorithms designed to replicate actual usage of a component in the hardware environment. Formal verification is another tool that is used in the verification environment, but due to its constraints from sensitivity to design sizes, verification exploits focus on various design reduction techniques. Formal verification is primarily deployed before the silicon stage—e.g., prototyping, for instance. The verification-specific designs or algorithms may be used at various levels of abstraction and at various stages of the design process to verify correctness of the design stages. Formal verification may be time consuming and may also involve large data sets communicated during the verification.

BRIEF DESCRIPTION OF THE DRAWINGS

Various embodiments in accordance with the present disclosure will be described with reference to the drawings, in which.

DETAILED DESCRIPTION

Figure 1:
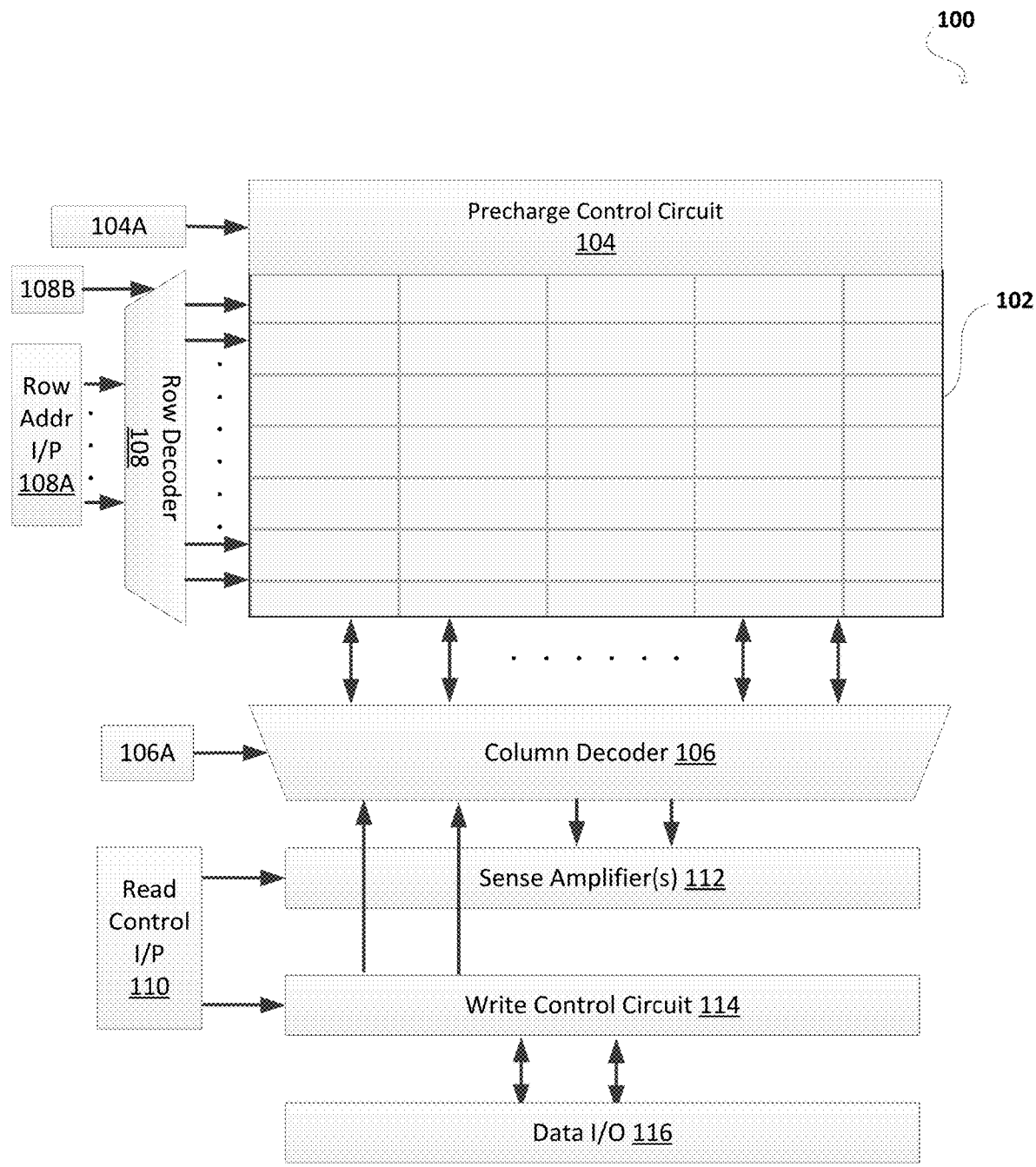
FIG. 1 illustrates an example memory array subject to verification in accordance with some embodiments of the present disclosure.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Systems and methods in accordance with various embodiments of the present disclosure overcome one or more of the above-described deficiencies and other deficiencies in conventional approaches to verification of components in a semiconductor device. In particular, in various embodiments, bit-reduction during verification of circuits in a verification environment is achieved for circuits that include memory arrays. The verification environment emulates the components of the circuit and their interactions. Input data, output data, and control for the components and their expected interactions are provided with reference to a predetermined model for the circuit. The predetermined model may include properties for verification with the components of the emulated circuit. As such, the predetermined model may be emulated with the circuit and may be used to verify the circuit. The circuit may be emulated as circuit data and the predetermined model as computer code. In an example of a bit-reduction during verification, when the circuit is determined as or is indicated as including a memory array, computer code associated with a different verification for generating or communicating fewer bits for a memory array may be used instead of an expected verification that replicates a hardware read operation for the memory array. The fewer bits are, therefore, fewer than the bits generated or communicated in the expected verification that replicates the hardware read operation.

The bit-reduction of the present disclosure achieves a counterpart delay that occurs in hardware read operations but uses a sampling of an address that reduces bits generated or communicated during the verification. This process, therefore, is more efficient for the verification environment and contrasts the hardware implementation of accessing the memory arrays but provides a verification that is robust. Such verification may be pre-silicon simulation verification or formal verification. The memory arrays include on-chip registers, caches, static random access memories (SRAMs), dynamic random access memories (DRAMs), and other structural and functional variations of memories arrays. In operation, a physical memory array of size M×N may be addressed using $\log_2 M$ address bits and may generate N number of data bits. The $\log_2 M$ address bits are required in the first clock cycle to address a data location for reading. This is followed by N bits of data read out from the data location in the second clock cycle. When a circuit is determined to include a memory array, verification may be conducted in a manner that replicates the above-described physical memory array—e.g., simulated or formal verification—using a similar asserted sampling delay for the data in the clock cycles for read access. As such, the data in such a verification process is sampled and made available at the output in a later clock cycle than the clock cycle in which the address is received. This verification communicates or generates N bits.

The bit-reduction during verification of the present method and system is associated with using computer code for a memory array that reduces a number of bits communicated or generated per cycle, during a read operation for verification of a memory array included in a circuit. In an aspect of the present disclosure, to reduce the number of bits communicated or generated per clock cycle during verification of a circuit, the verification may use computer code that samples an address in a read operation for the memory array determined as part of the circuit, instead of sampling generated data. In the verification, a sampled address may be retained for a later clock cycle than a cycle in which the address was received. In addition, the memory cell(s) associated with the sampled address may be accessed for data in the later clock cycle. The delay caused by sampling the address replicates the implementation in the physical memory array for the read operation. Here, the bits communicated or generated is $\log_2(M)$ or $\log_2(M+1)$ per cycle, and cumulatively, which is often smaller than an original N number of bits, and often significantly smaller than the original N number of bits generated or communicated every cycle of the sampling delay for the data. The $\log_2(M+1)$ bits is a result of sampling the address, which is $\log(M)$, and includes an additional value representing an absence of a read (or representing an illegal/irrelevant read).

As a result, the physical memory array behavior is maintained during verification of a circuit that may include a memory array, but a number of bits communicated or generated is lesser than a verification that may be performed without the bit-reduction of the present disclosure. An output retrieved using the sampled address in the second clock cycle is still associated with the address. In an example, the specific address under verification may include a consequent value related to an antecedent value previously written to the address. The output is verified against predetermined values (e.g., antecedent values) for the address to determine compliance for at least one property that may be defined for at least a component prior to the verification for the circuit. The compliance for the circuit may be based in part on a verification of a bit-reduced memory array used in the place of a memory array of a circuit. A predetermined model may be used to define or determine a bit-reduced memory array capable of applying sampling of an address instead of a result during a read operation. As such, for the predetermined model, the bit-reduced memory array may be used in the read operation to verify that an antecedent value of an address leads to the consequent value that is related to the antecedent value, for instance.

FIG. 1 illustrates an example 100 of a memory array 102 that is subject to verification in accordance with various embodiments of the present disclosure. As previously noted, while the example memory array 102 may include supporting circuitry for specific types of memory arrays—e.g., static random access memories (SRAMs), the present disclosure is also applicable for verification of registers, caches, dynamic random access memories (DRAMs), and other structural and functional variations of the example memory array 102. A person of ordinary skill would recognize the applicability of the present verification process to the other types of memory arrays using the present disclosure.

Example 100 includes a precharge control circuit 104, while reference numeral 104A represents precharge inputs to the precharge control circuit 104; a column decoder 106, with column address inputs represented via reference numeral 106A and with column control inputs provided via write control circuit 114; a row decoder 108, with row address inputs represented via reference numeral 108A and row control inputs 108B; and sense amplifiers 112 to assist with reading data and that receives read control inputs, via reference numeral 110. Reference numeral 116 represents data input/output to the memory array 102. A person of ordinary skill would recognize the operations and functionality of these control circuits 104-108, 112, 114, and of the control and address inputs 104A-108A, 108B, 110 to communicate data 116 into and out of the memory array 102.

The example memory array 102 may be replicated in a simulated environment, which may be by way of data in a file comprising functions related to each other and configured to accept inputs and to provide outputs by processing the inputs using the functions; or by way of a complied graphical simulation of the functions that can then process algorithms that include the inputs and associated assertions from properties to be verified for the functions. Formal verification may retain sections of a circuit—e.g., a memory array 102, setting aside the supporting control circuits 104-108, 112, 114. Formal verification may need statement of the properties to be verified; for example, a property for a circuit may be as to components of the circuit, including that an antecedent value applied to the components leads to a consequent value or result that is related to the antecedent value. A computer code may provide the properties to be verified by the verification in the simulated or formal verification environment.

Properties that may be verified include: that every input to the circuit triggers an output or another reaction, where computer code is associated with a design that uses a memory for storing untreated events or their attributes; that an order of transactions to the circuit is preserved, e.g., using first in—first out basis, where the compute code is associated with a design to use a memory to remember event identifiers (IDs) or time-stamps while other attributes of the memory are being processed in parallel; that an output is compliant with configurations in the circuit, e.g. low-priority packets are directed to port 0 and high-priority packets are directed to port 1, where the computer code is associated with a design that uses the memory to remember some packet attributes (e.g., ID and final destination), while processing other packet attributes (e.g., priority, source). The design may be in the predetermined model.

Figure 2:
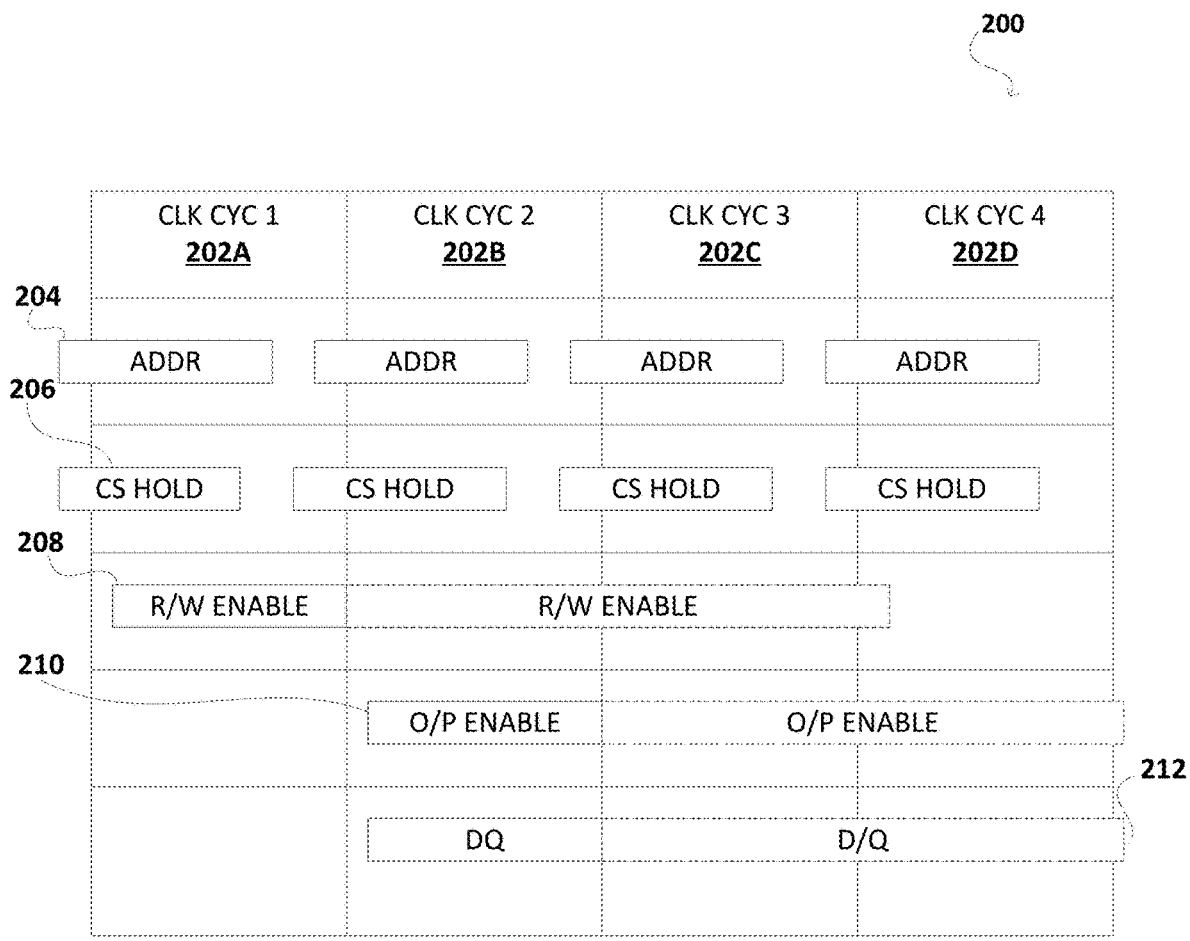
FIG. 2 illustrates an example clock cycle diagram used in example memory arrays for a read cycle and that is subject to verification according to some embodiments of the present disclosure.

FIG. 2 illustrates an example clock cycle diagram 200 used in example memory arrays, such as memory array 102, for a read cycle and that is subject to verification according to various embodiments of the present disclosure A data read cycle for a memory cell of memory array 102 requires selection of the cell via its row and column address. Further, a state of the memory cell may be determined as the data in the memory cell for the output or input 116 to the memory cell. In an example, the memory cell may be addressed by a series of steps performed in reference to a clock signal. Prior to a transition of an applied clock from a low to high wave to begin a read operation, row and column addresses 106A, 108A may be applied to address the memory array. A chip select 206 representing a control signal may also be asserted—for example, being low to select a memory array to accept the control and address inputs. A read or write enable control signal 208 may also be asserted for the read operation. These signals may be asserted but may also be held for an amount of time required to set up the appropriate control circuits 104-108, 112, 114, prior to the clock switching from low to high wave. As such, the illustration of FIG. 2 shows the R/W enable 208 and O/P enable 210 asserted in clock cycles 1 and 2, respectively, but also illustrates that these signals may be held or kept depending on the mode of the memory array to output data DQ. Such held or kept signaling is illustrated by the dashed lines, versus the asserted signal illustrated by the solid lines. The switching or transition of the clock from one low to high way to the next low to high wave may be taken as a single clock cycle 202A; 202B; 202C; 202D. However, a person of ordinary skill would recognize that example aspects herein may be modified based on the present teachings to achieve the verification described in a verification environment.

In the above example, the control signals 206, 208, 210 may be held for the amount of time as previously described, but the amount of time may be predetermined to ensure that the circuits 104-108, 112, 114 are ready to receive the control and address inputs after the clock switches to being a clock cycle. Additionally or alternatively, the amount of time is a requirement of the data output mode for the memory array. As the chip select 206 is held low before and past the start of the clock cycle, the memory array 102 may accept a provided address 204 and may accept the control signals for a read operation because of the state of a write enable signal 208 also being high (and held high) past the clock start cycle. The write enable signal 208 may be toggled low for a write operation occurs, but enables the memory array 102 for a read operation when held high. From the above, when the clock cycle 202A begins with an edge of the clock going high, an address 204 is registered and the read cycle is initiated. The output enable signal 210 is used to control when the data being read is available at the output from the memory array. For example, the output enable signal 210 being low allows for the output to show from the memory array. However, the output enable signal 210 being high places the data output path (and corresponding signal 212) in a tri state (or high impedance state). The data output 212 appears at the output of the memory array for subsequent use.

In an example, the data output 212 may be output at different times based in part on a configuration intended for the memory array 102 as part of an overall architecture. For example, the timing may be configured to as a pipeline—where the data is stored in output registers and is transferred from the output register to the output of a chip that includes the memory array 102, one clock cycle after the reading cycle begins (e.g., in a second clock cycle after the reading begins in a first clock cycle); as a flow through—where, in the same clock cycle, the data may appear on the output, but may require an additional clock cycle to be fully transferred out; as latched out—where, similar to the pipeline configuration, the data appears is loaded to a register in the first clock cycle, and then appears at the output in the second clock cycle; and as a burst mode, in flow through or pipeline configurations, where data appears consecutively starting from a provided address. Data being provided in the second clock cycle is often the configuration implemented for proper timing and correctness of a memory array within most devices.

Figure 3:
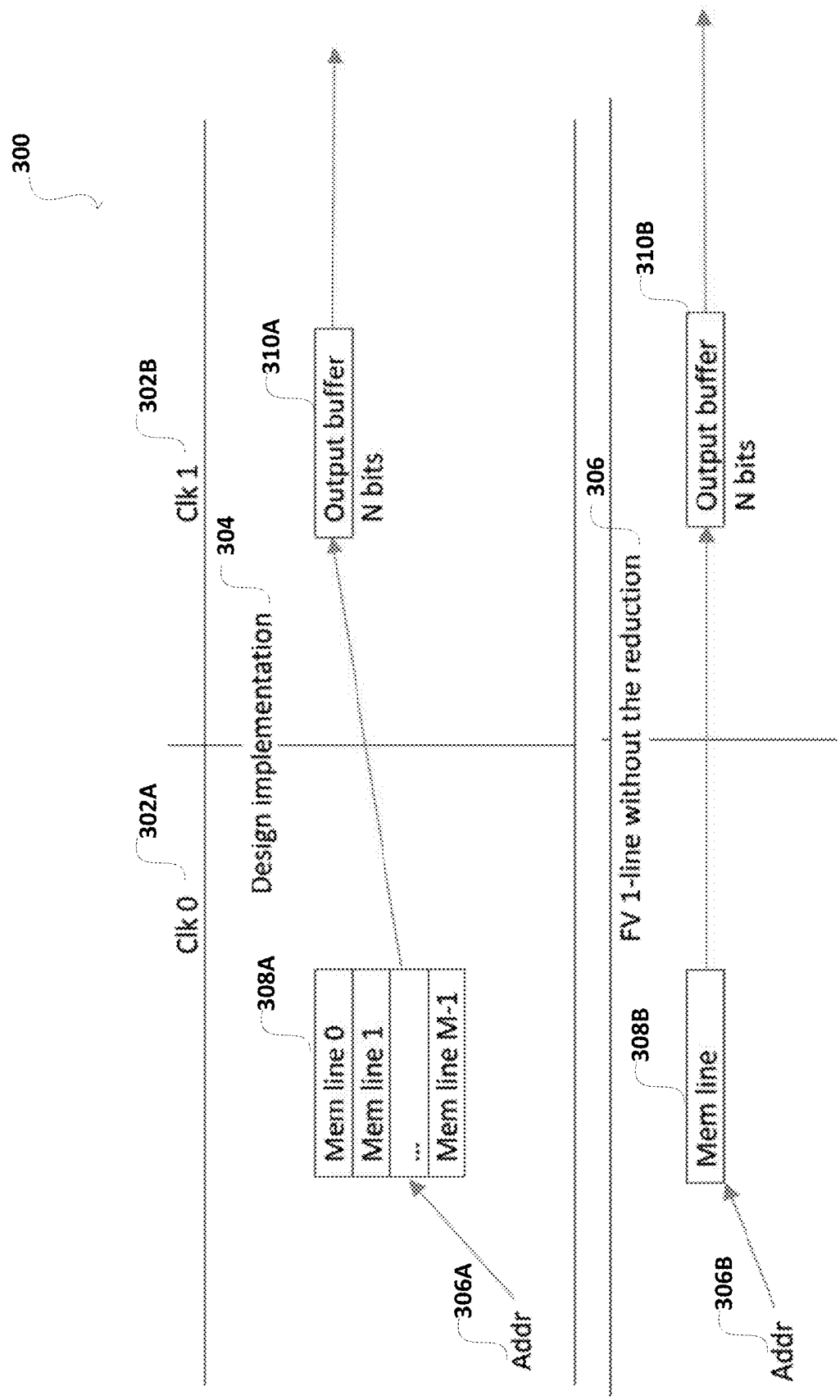
FIG. 3 illustrates example clock cycles of verification modes without bit-reduction in some embodiments of the present disclosure.

FIG. 3 illustrates example clock cycles 300 of verification modes without bit-reduction in various embodiments of the present disclosure. In a simulated environment, the same delay described is the implementations of FIGS. 1 and 2 are replicated, by a sampling of the data. For example, in the design implementation, as noted above, for a physical memory array of size M×N, where M is the number of address bits and N is the number of data bits. The log M number of bits is asserted or communicated in the first clock cycle 302A to address 306A a data location in the memory array 308A for reading. This is followed by N bits of data read out from the address to an output buffer in a second clock cycle 302B, and then the data is read out from the output buffer subsequently. As such, the verification environment uses a system that communicates a first set or a first number of bits that are associated with an address of the memory array in a first clock cycle during the read operation. The communication may be between the circuit data and the computer code. As part of an output, the system communicates a second set of second number of bits associated with the output of the address in a subsequent clock cycle to the first clock cycle. In this manner, the second number of bits is more than the first number of bits, but also the first and the second sets of bits, when used, may be relied upon for their content to determine that properties for the circuit as set forth in the predetermined model are being met.

The verification implementation 306—e.g., simulated or formal verification ("FV")—of the above physical memory array, therefore, relies on a sampling delay that is created for the data between the first and the second clock cycles to replicate the physical implementation. For example, address 306B is coded or cycled by an appropriate algorithm to a verification or data file including the memory array under verification. The address 306B is coded for the first clock cycle 302A to access memory location 308B. Data associated with the memory location 308B is sampled to the output buffer 310B at N bits. In this manner, the verification implementation 306 replicates the design implementation 304 to output the N bits of data from the output buffer 310B in the second clock cycle. The verification implementation 306 communicates or generates N bits every cycle.

Figure 4:
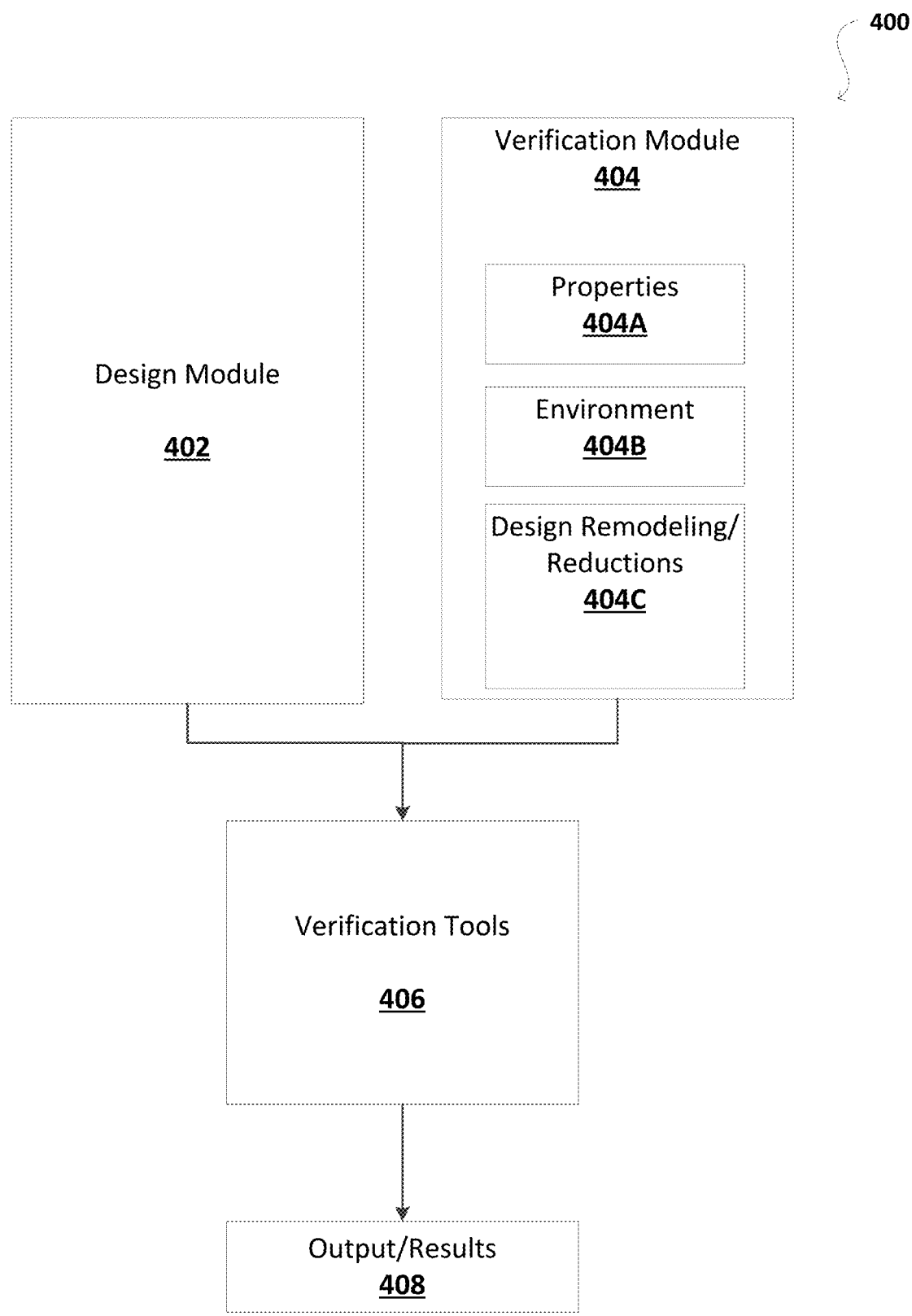
FIG. 4 illustrates an example block diagram of modules or tools of a verification environment used in formal verification of circuits with the present bit-reduction according to some embodiments of the present disclosure.

FIG. 4 illustrates an example block diagram 400 of modules or tools of a verification environment used in formal verification of circuits with the present bit-reduction according to various embodiments of the present disclosure. The example block diagram 400 includes a design module 402, a verification module 404, verification tools 406, and the output/results module 408. These modules may be hardware or software implementations, in an aspect of the present disclosure. In the case of hardware implementations, acceleration platforms maybe applicable to make the verification process faster.

Formal verification using appropriate code may be an exhaustive verification technology. As such, model checking for a property, if the property holds, implies that all possible executions to that property will always provide the same result. In an example, the property may be for a component of a circuit. The property may define an expected functionality, for example, of the component. Such an expected functionality may include an input, an output, and/or a performance of the component that may be based in part on the input and the output. Verification of the circuit then includes verification of the component and memory arrays associated with the circuit and may be particularly of the component. The verification goes through an entire space for the memory array and evaluates the system for correctness, while also being able to find erroneous behavior. Theoretically, as the memory array becomes more complex, complexity for the testing also rises exponentially with the size of the model it analyzes. Every additional memory bit potentially multiplies the number of possible states (and the states are stored in the computer memory). As such, more bits are generated or communicated at every clock cycle. For example, 10 memory bits leads to 1024 possible states, while 20 memory bits leads to one million states, 30 memory bits leads to one billion states, and 100 memory bits leads to $2^{100}$ states, which is approximately $10^{30}$ to a trillion$^{2.5}$ states. The effective number of memory bits per clock cycle, and generally, may be reduced, in the verification process, by design reductions. Additionally, devising properties that target smaller parts of the design may be also helpful in making such reductions.

In example block diagram 400 of FIG. 4, a design module 402 includes register transfer level (RTL) codes to be verified using the verification tools 406. The properties for formal verification may be provided in the verification environment for simulation or formal verification via sub-modules 404A, 404B in the verification module 404. Design remodeling and reduction are enabled in the verification module 404 by submodule 404C. The output and results are provided via module 408. Further, the example block diagram 400 may be implemented via hardware described in more detail in FIG. 7, for instance. In an example, when verification is in effect, a structure for the memory array may be determined. The structure determined may be that the memory array is configured as an SRAM. Input stimuli for the memory array may be determined to render in the simulation. The input stimuli may include definitions of the control signals required for the memory array to cause an output based in part on the structure. Outputs associated with the input stimuli are determined so that they may be verified once the simulation is executed. At least one property, as part of the verification, is then determined according to the input stimuli and the outputs.

Figure 5:
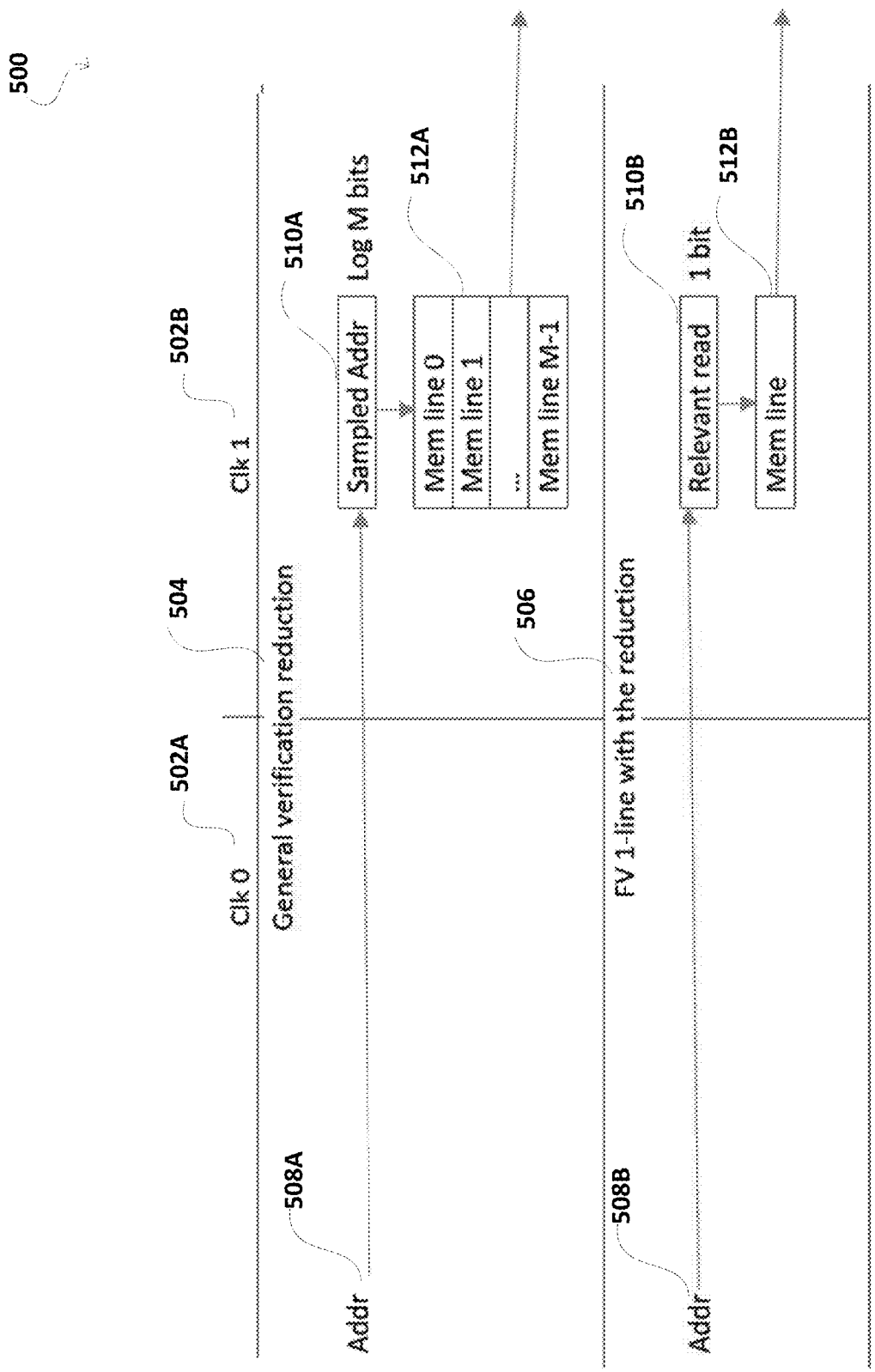
FIG. 5 illustrates example clock cycles of verification modes with bit-reduction of embodiments of the present disclosure.

FIG. 5 illustrates example clock cycles 500 of verification modes 504, 506, with bit-reduction of various embodiments of the present disclosure. As such, the example clock cycles 500 may be a result of the verification engines (e.g., in FIG. 4) analyzing the provided computer code with properties against the data for the circuit under verification. Bit-reduction, according to an embodiment of the present disclosure replicates the hardware differently than FIG. 3. For example, the bit-reduction verification of FIG. 5 delays the addressing of a memory array (e.g., memory array 512A) from the first clock cycle 502A—by sampling addresses 508A from the first clock cycle 502A to generate a sampled address 510A in the second clock cycle 502B, for instance. The sample address may be stored in the verification environment. In an example, the first clock cycle may be a pre-operation cycle and not part of the read operation itself. As such, the present disclosure provides a delay by sampling an address, but provides an output in a subsequent clock cycle, e.g., clock cycle 1 502B, to the pre-operation cycle.

The sample address is relied upon in a second clock cycle 502B, in the general verification bit-reduction process 504, to access the memory array (shown in a single column 512A). Further, a memory cell associated with the address is accessed for data in the second clock cycle 502B. The delay is taken as a delay to the read access procedure for the array instead of sampling the response as in the case of the use of an output buffer in the example clock cycles 300 of FIG. 3. Here, the number of bits communicated or generated is $\log_2(M+1)$ per cycle, which is often smaller than the original N number of bits, and often significantly smaller than the N bits every cycle of the sampling delay for the data. In this manner, it is possible to replicate the hardware delays, but at the same time, it is possible to make the verification process efficient in terms of bits communicated or generated per cycle.

The $\log_2(M+1)$ bits per cycle in verification 504 is a result of sampling the address, which is the $\log(M)$ part and which includes an additional value representing an absence of a read (or representing an illegal/irrelevant read). The output retrieved from verification 504 is associated with the address in the first clock cycle, but is delayed in retrieval because of the sampling of the address. The output is used for verification to determine compliance for at least one property that may be defined prior to the verification for the design under test. As previously noted in the case of the general verification 504, the property may be that an antecedent value applied to a component of the circuit data leads to a consequent value that is same as or related to (e.g., an acceptable variant of) the antecedent value, for instance.

Also in FIG. 5 is an illustration of example clock cycles 500 of formal verification 506 with bit-reduction. In this example, as in the case of the general verification 504, the verification replicates the hardware delay by sampling the address instead of a response from the memory array. The address 508B provided in the first clock cycle 502A and is sampled to provide a relevant read bit 510B in a subsequent clock cycle, such as second clock cycle 502B. As such, the relevant read bit may be only one bit. The relevant bit is generated or communicated in the second clock cycle 502B at a smaller punishment to the verification process than when data is sampled (1<N). In an example, when formal verification is in effect, a structure for the memory array is determined. The memory structure determined may be that the memory array is configured as an SRAM. A predetermined model of the memory array may be determined to include definitions of the timing, control, and data signals. At least one property, as part of the formal verification, is then defined according to the behavioral or predetermined model using a bit-reduced memory array—including, for example, an output or variation thereof expected for an applied write data at a memory location or that read and/or write operations are properly applied.

In an example flow, formal verification 506 may include determining the address of the memory array of a circuit for a verification performed to the circuit. In an aspect, the circuit is provided in the form of circuit data and is verified against a predetermined model. In a further aspect, the address may be determined according to a structure of a memory array, according to a randomized selection of a memory cell or line, and/or according to requirements of the circuit defined as part of the predetermined model. The address may be a pre-defined address. The pre-defined address (or simply, address) may be taken as representative of the memory array generally during the verification of the circuit. As such, a read operation of the address may be taken as representative of the functioning of the memory array. A flag bit may be asserted with a 1-bit value representing a "high" value (e.g., "1") in relation to a read from a relevant memory line or a cell of the memory array, for instance. The flag may be asserted (or not asserted) based in part on one of a selection of the address under the read operation, selection of a read request, selection of a read operation to a second address of the memory array (other than the address under the read operation), and selection of a read operation for a sampled address that exceeds a regular address range that comprises the address. A read operation from a sampled address that exceeds a regular address (e.g., from an out-of-range or non-existent address results in garbage output and therefore requires no flag assertion or treatment. This feature is exploited in order to represent an absence of read operation as a read from a non-existent address when all addresses are supported (e.g., all addresses are not in a single flagged address variant). Thereafter, a relationship between the flag and an output associated with the address may be modeled or determined. When the flag has a value of "1" and the output has an expected value or when the flag has a value "0" and the output has garbage bits, an indication is provided that the circuit is in compliance with the at least one property based in part on the read operation and the output complying with a predetermined model.

A feature of the predetermined model may adapt the verification for the bit-reduced memory array using an address of the bit-reduced memory array—e.g., by a determination that an output, such as a value in the address of the memory array, availability of which, in the verification process, coincides with a high ("1") value of the flag. Moreover, in an aspect using the pre-defined address as representative of the bit-reduced memory array, there may be no need to check all the addresses during the verification of the circuit including the memory array, then the computer code associated with the verification as to memory array may be coded to maintain only the addresses flagged using the flag. Thereafter, as part of the verification, providing the address for the generation of the output in the verification is sufficient to indicate that data is being properly applied to the address line (or cell) as part of the verifying of the circuit that includes the memory array. This may be sufficient to determine compliance of the memory array and uses only a 1-bit value in the reading process—i.e., reading the data as output in case of "1" for the flag or reading garbage bits as output in case of "0".

In an alternate example flow, using formal verification 506 and determining the address of the memory array for the verification performed to the circuit that includes a memory array, a representative memory cell (e.g., pre-defined address) may be taken for a memory address line by the sampling process. As such, only a 1-bit address including a 1-bit value ("0" or "1") may be asserted in the sampling process and may be, therefore, associated with a flag and an address for a memory cell or line, for instance. Verification in the bit-reduced memory array may include a feature to effect a change to representative memory cell or line. The change to the representative memory cell may occur when a write data is inserted in the memory line having the association to the relevant read address. This may be in the predetermined model for the bit-reduced memory array. Thereafter, as part of the verification, determining changes to content of a flagged address (associated with a flag) confirms a change in the memory cell or line of the pre-defined address by the generation and verification of the output, for instance. In the verification, the memory array provides the output for the pre-defined address (in case of "1" for the flag) or reading garbage bits as reference in case of "0" for the flag in the 1-bit value.

In a further example, the sample address (relevant read 510B) is relied upon in a second or subsequent clock cycle 502B, in the formal verification bit-reduction process 506, to access the memory cell (shown in a single cell 512B). Alternatively, a memory cell or line associated with the pre-defined address 510B is accessed whenever the flag is associated with a "1" value. The delay asserted in this process 506 may be taken as a delay to the read access procedure by sampling the address (or the bit associated with the flag) instead of sampling a response from the memory cell as in the case of the example clock cycles 300 of FIG. 3. This process replicates the physical memory array behavior, but the bits communicated or generated are often smaller than the original N, and often significantly smaller than the N bits every cycle of the sampling delay for the data as in FIG. 3. A retrieved output from the memory line 512B is associated with the relevant read 510B in the second clock cycle, but may be retrieved only to determine if any change has occurred by a flag set for the relevant read. The output of the memory line being verified against predetermined values for the address to determine compliance for a predetermined model of the bit-reduced memory array. A feature verified for the bit-reduced memory array may be that an antecedent value of the address leads to a consequent result that is related to by an acceptable variant of the antecedent value, for instance. In an example, the output is generated with a predetermined bit and with garbage bits.

Figure 6:
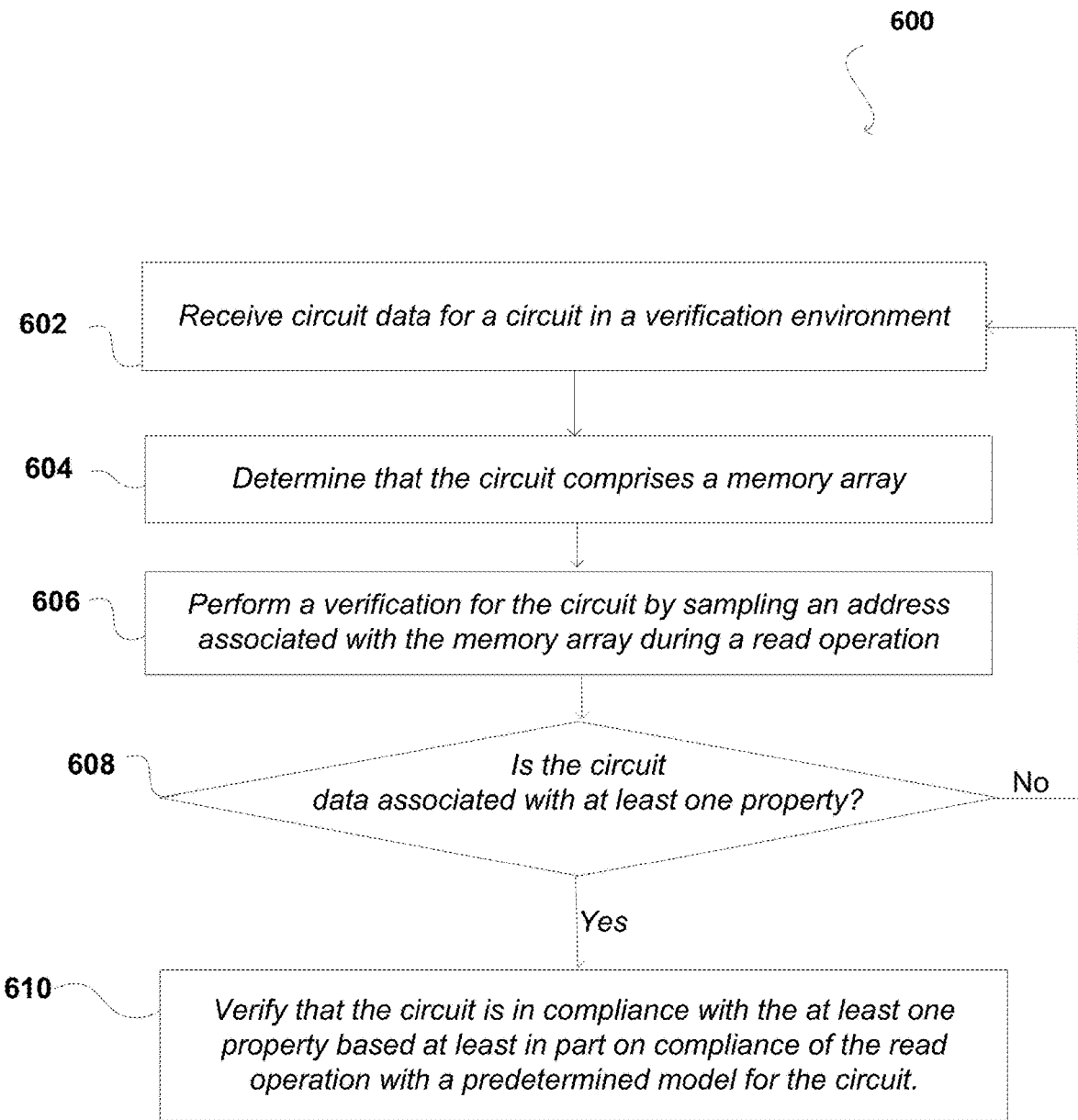
FIG. 6 is a flow diagram of an example process for bit-reduced verification in accordance with various embodiments.

FIG. 6 is a flow diagram 600 of an example process for bit-reduced verification in accordance with various embodiments. Sub-process 602 receives circuit data for a circuit in a verification environment. In an example, as previously noted, the circuit data is associated with a predetermined model including at least one property which may correspond to functionality of the circuit. Sub-process 604 determines that the circuit includes a memory array. Such a determination may be made, for instance, by indications within the circuit data or by circuit descriptions received in the verification environment. When it is determined that a memory array is included, a bit-reduced memory array as described in the present disclosure is used to in the place of a memory array portion of the circuit. In an example, a predetermined model may include the memory array for verification in the place of the memory array of the circuit. In an example, sub-process 606 illustrates verification for the circuit performed by a sampling of an address associated with the memory array, from the predetermined model, during a read operation. In an aspect, an address for the read operation may be received in a first clock cycle, but the address is sampled subsequent to receipt. As such, a delay is created between the first clock cycle and a subsequent clock cycle, which may be a second clock cycle, for instance. Further, the sampling itself may take place in the first clock cycle so that a sampled address is made available in a second clock cycle. The sampled address provides the access to the memory array in the second clock cycle, according to aspects of the present disclosure.

Sub-process 608 determines whether the circuit data is associated with at least one property, which may be a reference to determine failure or success of the circuit after verification. A negative determination that the circuit data does not comply with at least one property may result in new circuit data for the circuit, with the new circuit data being associated with at least one property for verification. When the circuit is determined to include a memory array, a bit-reduced memory array may be used in the place of the memory array of the circuit. An appropriate read operation may be tested for the memory array using the predetermined model provided in a computer code. For example, a property may be that the memory array is configured for reading/writing in an expected manner. A positive determination from sub-process 608 initiates sub-process 610. In sub-process 610 a verification of compliance for the circuit to the at least one property is made. For example, when an output of an address in the read operation is deemed to be proper (e.g., related to a prior input or an expected output), at least one property under verification for the circuit including the memory array is completed, and consequently, the circuit is verified. The compliance of the circuit is based in part on compliance of the read operation with a predetermined model of a bit-reduced memory array applied in the place of a memory array portion of the circuit under verification.

The positive determination may further log the positive determination for the memory cell or memory line, and may then continue with other property tests or verification of other memory cells. In a further example, a negative determination may be simply logged without repeating the sampling and the subsequent sub-processes. Further, the sampling of the address may use the memory cell or memory address as representative of the integrity for neighboring memory cells. As such, only a random cell may be selected for verification for each of multiple verification cycles. In sub-process 610, the above example verification to the output may be performed to determine compliance of memory array with the property determined for the memory array. In an example, a log file is provided to collect the output. The output may include bits per cycle of a data signature, for example. The log file may be rendered in a post-verification environment to generate a flag indication of the compliance of the predetermined model with the property for the address of the memory array.

In an aspect, when the memory array is of a specific structure that prevents collisions between read and write requests, the present verification addresses the property of storage in the read operation. For example, in some RAM structure memories, contention from simultaneous read and write is not permissible. In memory array structures where contentions are allowed, a bypass may be applicable, where the data obtained in a read operation, during the contention, is of the latest written value rather than a previous or an old value. In the case of memory array structures using register arrays, the collision itself may not be rectified. However, a solution included herein allows for reading out of garbage, in case of contention. In case such a contention results in a property failure (due to the garbage read out), the failure may be attributed to several reasons in various models. Sometimes, the failure may be false, as a result of a difference between an original memory array included in the circuit data for the predetermined model and the reduced memory array used in its place, which manifests in the contention treatment. Furthermore, contentions are undesirable, even when allowed in some memory arrays. In the case of undesirable contentions, a failure is indicated as a real failure. Such a case may then rely on an explicit model checking property, instead, for a read-write contention from a memory array having a structure known to be unsupportive of specific collision avoidance features.

Figure 7:
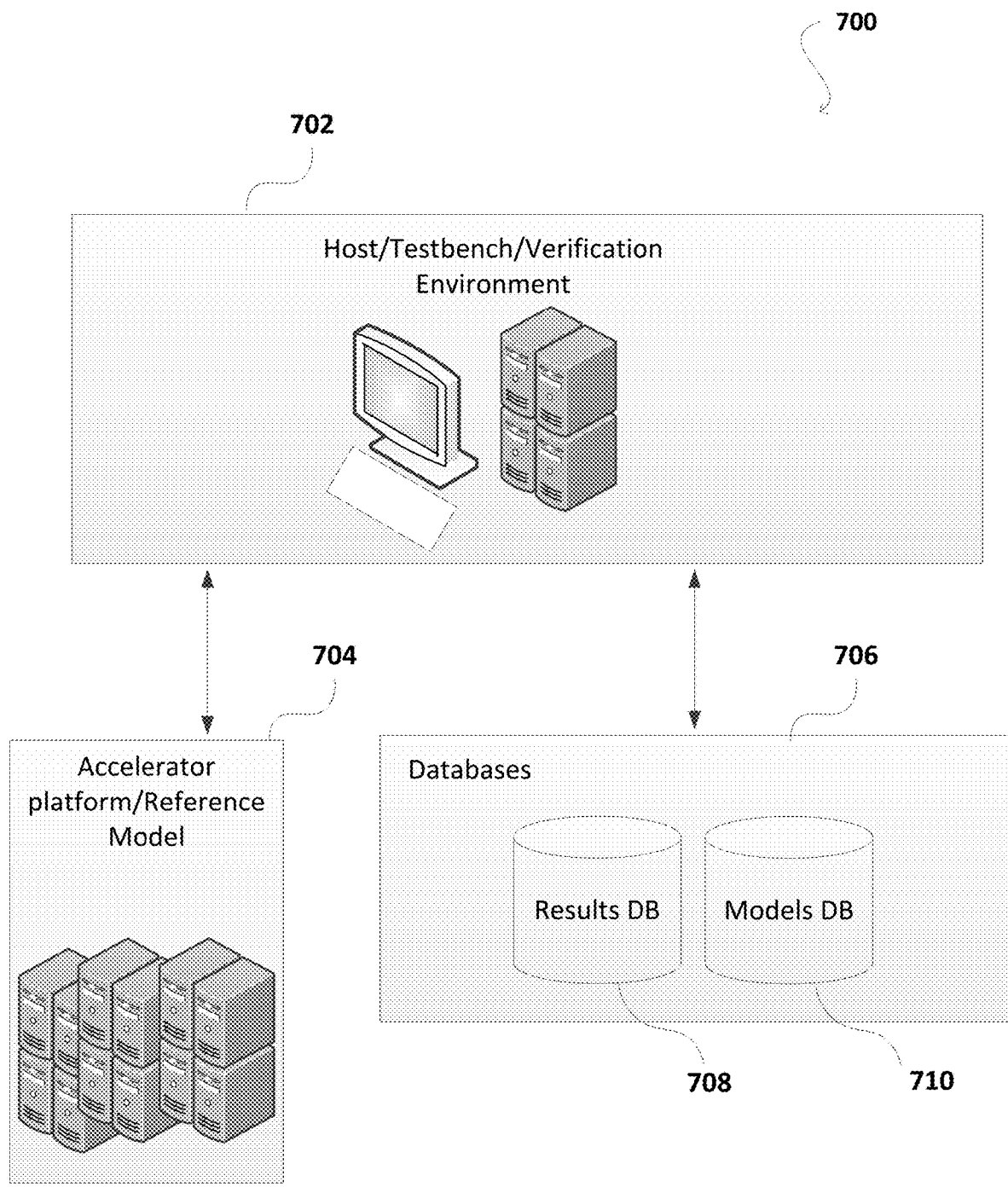
FIG. 7 is an example architecture of a system for bit-reduced verification in accordance with various embodiments of the present disclosure.

FIG. 7 is an example architecture 700 of a system for bit-reduced verification in accordance with various embodiments of the present disclosure. As will be appreciated, although an environment, as shown, may use direct connectivity, remote connectivity is also available to enable the present disclosure. The system 700 includes computing devices as part of a host/Testbench/Verification environment 702; databases 708, 710 in database platform 706; and optional accelerator platform or a reference model platform 704. The computing devices for platform 702 may include application specific computers and servers capable of fast computing and compression of data for performing complex and large scale verifications.

The network provided for interconnectivity of the platforms 702-706 can include any appropriate network, including a physical network, an intranet, the internet, a cellular network, a local area network or any other such network or combination thereof. The network could be a "push" network, a "pull" network, or a combination thereof. In a "push" network, one or more of the servers push out data to a client device remote from the platforms 702-706. In a "pull" network, one or more of the servers send data to the client device upon request for the data by the client device. Components used for such a system can depend at least in part upon the type of network and/or environment selected. Protocols and components for communicating via such a network are well known and will not be discussed herein in detail. Communication over the network can be enabled via wired or wireless connections and combinations thereof, although for other networks, alternative devices or settings serving a similar purpose could be used, as would be apparent to one of ordinary skill in the art after reading the present disclosure.

The illustrative system 700 includes a data store or databases 708, 710 platform 706. It should be understood that there can be several application servers, layers or other elements, processes or components, which may be chained or otherwise configured, which can interact to perform tasks such as obtaining data from an appropriate data store.

Further, the servers in platforms 704, 706 and their corresponding applications may be part of a verification system 700. As used herein, data store or database refers to any device or combination of devices capable of storing, accessing and retrieving data, which may include any combination and number of data servers, databases, data storage devices and data storage media, in any standard, distributed or clustered environment. The servers in these platforms can include any appropriate hardware and software for integrating with the data store as needed to execute aspects of one or more applications for the client device and handling the verification requirements for large and complex memory array verifications.

The data store can include several separate data tables, databases or other data storage mechanisms and media for storing data relating to a particular aspect. For example, the data store, as illustrated, includes mechanisms for storing content (e.g., verification and complex model data) and results information from the verification. The data store may also include logs for logging success or failures throughout the verification cycles. It should be understood that there can be many other aspects that may need to be stored in the data store, such as page image information and access rights information, which can be stored in any of the above listed mechanisms as appropriate or in additional mechanisms in the data store. The data store is operable, through logic associated therewith, to receive instructions from the server in platforms 702, 704.

In an example, the data store may update or otherwise process data in response thereto. In one example, a request for verification for a model may cause a requirement to verify the identity of the requester and the correctness of the request, prior to conducting the requested verification. Information associated with the request can then be returned to the requester, such as in a results listing on a page that the user is able to view on the computing device. Each server in platforms 702, 704 include an operating system that provides executable program instructions for the general administration and operation of that server and typically will include computer-readable medium storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein. However, more or fewer components can be used as structured code can be executed on any appropriate device or host machine as discussed elsewhere herein.

The platforms 702-706 may include one or more resources, servers, hosts, instances, routers, switches, databases, other similar components, or a combination thereof. The resources of the platforms 702-706 are not limited to storing and providing verification or access to verification data. Indeed, there may be several product servers, layers, or other elements, processes, or components, which may be chained or otherwise configured, and which can interact to perform tasks including, for example, obtaining data from an appropriate database. As used in this specification, database also refers to any device or combination of devices capable of storing, accessing, and retrieving data, which may include any combination and number of data servers, databases, data storage devices, and data storage media, in any standard, distributed, or clustered environment.

The databases of the platform 706 can include several separate data tables, databases, or other data storage mechanisms and media for storing data relating to a particular aspect. For example, the databases of the platform 706 illustrated include mechanisms for storing results data and model data, which can be used to provide verification and for remodeling or adjusting the properties intended for testing of a memory array. Each server of the platforms 702, 704 typically includes an operating system that provides executable program instructions for the general administration and operation of that server, and typically will include a computer-readable medium storing instructions that, when executed by a processor of the server, enable the server to perform its intended functions. Suitable implementations for the operating system and general functionality of the servers are known or commercially available, and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 7. Thus, the depiction of the system 700 in FIG. 7 should be taken as being illustrative in nature and not limiting to the scope of the disclosure.

The various embodiments can be implemented in a wide variety of operating environments, which in some cases can include one or more user computers, computing devices, or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Various aspects also can be implemented as part of at least one service or Web service, such as may be part of a service-oriented architecture for external communication of the results, for example. Services such as Web services can communicate using any appropriate type of messaging, such as by using messages in extensible markup language (XML) format and exchanged using an appropriate protocol such as SOAP (derived from the "Simple Object Access Protocol"). Processes provided or executed by such services can be written in any appropriate language, such as the Web Services Description Language (WSDL). Using a language such as WSDL allows for functionality such as the automated generation of client-side code in various SOAP frameworks.

Some embodiments utilize at least one network that would be familiar to those skilled in the art for supporting communications using any of a variety of commercially-available protocols, such as TCP/IP, OSI, FTP, UPnP, NFS, CIFS, and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including HTTP servers, FTP servers, CGI servers, data servers, Java servers, and business map servers. The server (s) also may be capable of executing programs or scripts in response requests from user devices, such as by executing one or more Web applications that may be implemented as one or more scripts or programs written in any programming language, such as Java®, C, C# or C++, or any scripting language, such as Perl, Python, or TCL, as well as combinations thereof. The server(s) may also include database servers, including without limitation those commercially available from Oracle®, Microsoft®, and IBM®.

The environment can include a variety of databases and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices, or any other medium which can be used to store the desired information and which can be accessed by the a system device. Based on the disclosure and teachings provided herein, a person of ordinary skill in the art will appreciate other ways and/or methods to implement the various embodiments. Additionally, if a particular decision or action is described as being made or performed "based on" a condition or piece of information, this should not be interpreted as that decision or action being made or performed exclusively based on that condition or piece of information, unless explicitly so stated.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A system comprising:
   at least one processor; and
   memory including instructions that, when executed by the at least one processor, cause the system to:
   receive circuit data for a circuit in a verification environment, the circuit comprising a memory array;
   determine computer code comprising a property for a component of the circuit as part of a verification to be performed for the circuit;
   sample an address received in a read operation for accessing the memory array during verification, the sample of the address associated with fewer bits than a second sample of read data within the address;
   retrieve an output associated with the address; and
   verify that the circuit is in compliance with the property based on the read operation and the output complying with a predetermined model.

2. The system of claim 1, wherein the instructions when executed by the at least one processor further enable the system to:
   determine the address for the memory array as part of the computer code;
   assign write data for the address in the computer code; and
   determine the predetermined model based on the address and the write data.

3. The system of claim 1, wherein the instructions when executed by the at least one processor further enable the system to:
   receive a structure for the memory array;
   determine the predetermined model based on the structure; and
   determine the property according to the circuit.

4. The system of claim 1, wherein the instructions when executed by the at least one processor further enable the system to:
   receive a structure for the memory array;
   determine input stimuli for the memory array based on the structure; and
   determining the predetermined model according to the input stimuli and the output associated with the address.

5. The system of claim 4, wherein the instructions when executed by the at least one processor further enable the system to:
   verify that the output is as expected for the predetermined model to determine the compliance for the memory array.

6. The system of claim 1, wherein the instructions when executed by the at least one processor further enable the system to:
   generate a first number of bits associated with an address of the memory array in a first clock cycle during the read operation; and
   generate a second number of bits associated with the output of the address in a subsequent clock cycle to the first clock cycle, the second number of bits being more than the first number of bits.

7. A computer-implemented method comprising:
   receiving circuit data for a circuit in a verification environment;
   determining that the circuit comprises a memory array;
   performing a verification for the circuit by sampling an address associated with the memory array during a read operation; and
   verifying that the circuit is in compliance with a property associated with the circuit data based on compliance of the read operation with a predetermined model.

8. The computer-implemented method of claim 7, further comprising:
   determining the address and write data for the address; and
   assigning the write data to computer code for the verification with the circuit data; and
   determining the predetermined model based on the address and the write data.

9. The computer-implemented method of claim 7, further comprising:
   determining a structure for the memory array;
   determining the predetermined model based on the structure; and
   determining the one property according to the circuit.

10. The computer-implemented method of claim 7, further comprising:
    determining a structure for the memory array;
    determining input stimuli for the memory array; and
    determining the predetermined model according to the input stimuli and an output from the memory array.

11. The computer-implemented method of claim 7, further comprising:
    generating a first number of bits associated with the address in a first clock cycle; and
    generating a second number of bits associated with an output of the address in a subsequent clock cycle to the first clock cycle, the second number of bits being more than the first number of bits.

12. The computer-implemented method of claim 7, wherein the memory array is a static random access memory (SRAM) or is configured as: a register-to-latch, a register-to-register, or a burst-mode memory array.

13. The computer-implemented method of claim 7, wherein, when an output associated with the address comprises garbage bits, during the read operation, a failure is determined for the address.

14. The computer-implemented method of claim 7, wherein, an output associated with the address in the read operation comprises a predetermined bit and garbage bits, the predetermined bit associated with the predetermined model.

15. The computer-implemented method of claim 7, further comprising:

collecting a log file comprising bits per cycle of the verification performed to the memory array; and rendering the log file in a post-verification environment to determine a flag indication of the compliance of the circuit with the property.

16. The computer-implemented method of claim 7, further comprising:

determining the address as a relevant read address for the verification;

asserting a flag with a 1-bit value, the flag associated with the relevant read address;

causing a change to write data in the relevant read address based on the flag;

verifying a relationship between the flag and an output associated with the address, wherein if the flag has a value of "1" and the output has an expected value or if the flag has a value "0" and the output has garbage bits, an indication is provided that the circuit is in compliance with the property.

17. A non-transitory computer-readable storage medium including instructions that, when executed by at least one processor, cause the at least one processor to:

receive circuit data for a circuit in a verification environment;

determine that the circuit comprises a memory array;

perform verification for the circuit by sampling an address associated with the memory array during a read operation; and verify that the circuit is in compliance with a property associated with the circuit data based on compliance of the read operation with the predetermined model.

18. The non-transitory computer-readable storage medium of claim 17, wherein the instructions when executed further cause the at least one processor to:

determine the address as a relevant read address for the verification;

assert a flag with a 1-bit value, the flag associated with the relevant read address;

causing a change to write data in the relevant read address based on the flag;

verify a relationship between the flag and an output associated with the address, wherein if the flag has a value of "1" and the output has an expected value or if the flag has a value "0" and the output has garbage bits, an indication is provided that the circuit is in compliance with the property.

19. The non-transitory computer-readable storage medium of claim 17, wherein the instructions when executed further cause the at least one processor to:

collect a log file comprising bits per cycle of the verification performed to the memory array; and render the log file in a post-verification environment to determine a flag indication of the compliance of the circuit with the property.

20. The non-transitory computer-readable storage medium of claim 17, wherein the instructions when executed further cause the at least one processor to:

determine that an output from the memory array is associated with a predetermined bit and with garbage bits;

determine that a flag is asserted high or low for: a selection of the address, a selection of a read request, a selection of a read operation to a second address of the memory array, or a selection of a read operation for a sampled address that exceeds a regular address range that comprises the address; and verify the circuit based on the flag.

* * * * *